United States Patent
Yazdanshenas et al.

(10) Patent No.: US 12,431,903 B2
(45) Date of Patent: Sep. 30, 2025

(54) FREEZE AND CLEAR LOGIC CIRCUITS AND METHODS FOR INTEGRATED CIRCUITS

(71) Applicant: Intel Corporation, Santa Clara, CA (US)

(72) Inventors: Sadegh Yazdanshenas, Toronto (CA); Jeffrey Chromczak, Toronto (CA)

(73) Assignee: Altera Corporation, San Jose, CA (US)

( * ) Notice: Subject to any disclaimer, the term of this patent is extended or adjusted under 35 U.S.C. 154(b) by 679 days.

(21) Appl. No.: 17/703,974

(22) Filed: Mar. 24, 2022

(65) Prior Publication Data

US 2022/0216873 A1    Jul. 7, 2022

(51) Int. Cl.
*H03K 19/177* (2020.01)
*H03K 19/20* (2006.01)

(52) U.S. Cl.
CPC ........... *H03K 19/177* (2013.01); *H03K 19/20* (2013.01)

(58) Field of Classification Search
CPC .... H03K 19/02; H03K 19/173; H03K 19/177; H03K 19/17728; H03K 19/20; H03K 17/51; H03K 17/56; H03K 17/687; H03K 17/693
See application file for complete search history.

(56) References Cited

U.S. PATENT DOCUMENTS

| | | | | |
|---|---|---|---|---|
| 5,559,753 A * | 9/1996 | Kocis | ................... | G11C 7/1051 365/236 |
| 6,611,920 B1 * | 8/2003 | Fletcher | ................. | G06F 1/3237 713/320 |
| 7,236,010 B1 * | 6/2007 | Keith | ............... | H03K 19/17784 326/47 |
| 8,832,608 B1 * | 9/2014 | Chakrabarty | ......... | G06F 30/327 716/51 |
| 2010/0156458 A1 * | 6/2010 | Speers | ............. | H03K 19/17772 326/39 |
| 2018/0356464 A1 * | 12/2018 | Hutter | ...................... | G09C 1/00 |

(Continued)

OTHER PUBLICATIONS

Chin et al. "A Case for Hardened Multiplexers in FPGAs," 2013 International Conference on Field-Programmable Technology (FPT), 2013, pp. 42-49.

(Continued)

*Primary Examiner* — Jason M Crawford
(74) *Attorney, Agent, or Firm* — InventIQ Legal LLP; Steven J. Cahill (57) ABSTRACT

An integrated circuit includes a programmable logic circuit and freeze circuitry coupled to receive a freeze signal and a control signal. The integrated circuit also includes a logic circuit coupled to receive an output signal of the programmable logic circuit. The logic circuit is also coupled to receive an output signal of the freeze circuitry. The freeze circuitry causes an output signal of the logic circuit to be in a predefined logic state in response to the freeze signal being asserted during power-up of the integrated circuit. The integrated circuit also includes clear circuitry that asserts the control signal in response to a clear signal being asserted after the power-up of the integrated circuit. The freeze circuitry causes the output signal of the logic circuit to be in the predefined logic state in response to the control signal being asserted.

20 Claims, 5 Drawing Sheets

(56) References Cited

U.S. PATENT DOCUMENTS

2021/0109153 A1* 4/2021 Waayers ............... G06F 30/333
2022/0216873 A1* 7/2022 Yazdanshenas .............................
H03K 19/17772

OTHER PUBLICATIONS

Chin et al., "Hybrid LUT/Multiplexer FPGA Logic Architectures," IEEE Transactions on Very Large Scale Integration (VLSI) Systems, vol. 24, No. 4, Apr. 2016, pp. 1280-1292.
Anderson et al., "Improving Logic Density Through Synthesis-Inspired Architecture," 2009 International Conference on Field Programmable Logic and Applications, pp. 105-111.

* cited by examiner

FREEZE AND CLEAR LOGIC CIRCUITS AND METHODS FOR INTEGRATED CIRCUITS

FIELD OF THE DISCLOSURE

The present disclosure relates to electronic circuitry, and more particularly, to freeze and clear logic circuits and methods for integrated circuits.

BACKGROUND

A programmable logic integrated circuit is a type of integrated circuit that can be programmed by a user to implement desired custom logic functions. In a typical scenario, a logic designer uses computer-aided design tools to design a custom logic circuit. When the design process is complete, the computer-aided design tools generate configuration data. The configuration data is loaded into memory elements in a programmable logic integrated circuit to configure the programmable logic integrated circuit to perform the functions of the custom logic circuit.

DETAILED DESCRIPTION

One or more specific examples are described below. In an effort to provide a concise description of these examples, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Throughout the specification, and in the claims, the term "connected" means a direct electrical connection between the circuits that are connected, without any intermediary devices. The term "coupled" means either a direct electrical connection between circuits or an indirect electrical connection through one or more passive or active intermediary devices. The term "circuit" may mean one or more passive and/or active electrical components that are arranged to cooperate with one another to provide a desired function.

Programmable logic integrated circuits (ICs) often use freeze logic circuitry to prevent circuit contention during power-up. As an example, freeze logic circuitry may be incorporated into each programmable logic circuit block in a programmable logic IC to maintain the outputs of the programmable logic circuit block constant during power-up of the IC. After power-up of the IC, the freeze logic circuitry has no further utility during user mode of the IC. However, inter-block signal paths in a user design mapped to the programmable logic IC pass through the freeze logic circuitry in the programmable logic circuit blocks. As a result, the freeze logic circuitry adds delays and power consumption to a user design for a programmable logic IC during user mode. The freeze logic circuitry is not visible to users through the computer-aided design tools used for previously known programmable logic ICs.

According to some examples disclosed herein, clear logic circuitry is provided in a programmable logic circuit block in an integrated circuit (IC) that makes freeze logic circuitry in the programmable logic circuit block visible to a user during configuration of the IC. As an example, the freeze logic circuitry in the programmable logic circuit block may be controlled by the clear logic circuitry that is used for implementing a clear function. The freeze logic circuitry may be controlled by a user of the IC to provide more efficient signal gating of the programmable logic circuit block for applications, such as multiplexer buses. In this exemplary application, buses of multiplexers are decomposed into logic equations, where NAND gates are mapped to the programmable logic circuit block, resulting in smaller lookup-tables (LUTs) that are mapped to the rest of the IC, as disclosed in further detail below.

Figure 1:
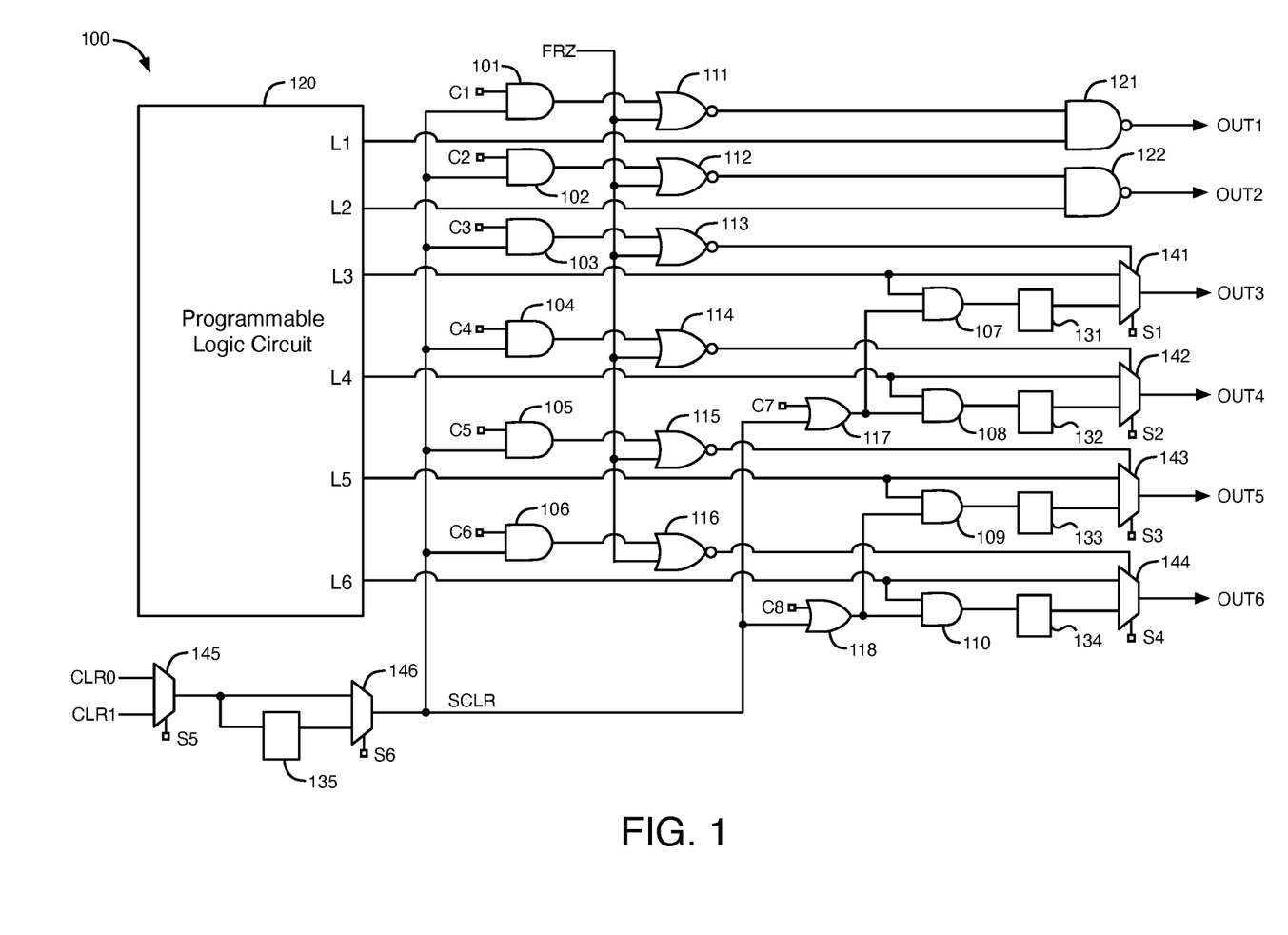
FIG. 1 is a diagram that illustrates an example of a programmable logic circuit block in an integrated circuit (IC) that includes freeze logic circuitry and logic circuits that make the freeze logic circuitry visible to a user of the IC.

FIG. 1 is a diagram that illustrates an example of a programmable logic circuit block 100 in an integrated circuit (IC) that includes freeze logic circuitry and clear logic circuitry that makes the freeze logic circuitry visible to a user of the IC. The programmable logic circuit block 100 of Figure (FIG. 1 includes a programmable logic circuit 120, AND logic gate circuits 101-110, NOR logic gate circuits 111-116, OR logic gate circuits 117-118, NAND logic gate circuits 121-122, flip-flop storage circuits 131-135, and multiplexer circuits 141-146. In the example of FIG. 1, the freeze logic circuitry includes AND logic gate circuits 101-106 and NOR logic gate circuits 111-116. The freeze logic circuitry provides user-controllable freeze functionality to programmable logic circuit block 100 without adding additional delays to output signals of programmable logic circuit 120, as described below.

Programmable logic circuit block 100 may be, for example, an arithmetic logic module that is configurable to perform arithmetic operations. Programmable logic circuit block 100 may be provided in any type of integrated circuit (IC), such as a programmable logic integrated circuit (IC), a microprocessor IC, or a graphics processing unit IC. The programmable logic circuit 120 of FIG. 1 may be any type of programmable logic circuit. For example, programmable logic circuit 120 may be a combinatorial logic circuit, such as a look-up table (LUT) circuit.

A freeze signal FRZ is provided to a first input of each of the NOR logic gate circuits 111-116, as shown in FIG. 1. During power-up of the IC containing programmable logic circuit block 100, the FRZ signal is asserted to a logic high state (e.g., at a supply voltage VCC provided to block 100). In response to the freeze signal FRZ being asserted to a logic high state, the output signal of each of the NOR gate circuits 111-116 is driven to a logic low state. In response to the output signals of the NOR gate circuits 111-112 being in logic low states, NAND gate circuits 121-122 drive their output signals OUT1 and OUT2 to logic high states (e.g., at the supply voltage VCC), respectively. In response to the output signals of the NOR gate circuits 113, 114, 115, and 116 being in logic low states, multiplexer circuits 141, 142, 143, and 144 drive their output signals OUT3, OUT4, OUT5, and OUT6 to logic high states (e.g., at the supply voltage), respectively. NAND gate circuits 121-122 and multiplexer circuits 141-144 maintain their output signals OUT1-OUT6, respectively, constant in logic high states, while the freeze signal FRZ is asserted high during power-up of the IC.

After power-up of the IC, the freeze signal FRZ is de-asserted to a logic low state (e.g., ground), and the IC may be configured according to a user design in a configuration mode, if the IC is a programmable logic IC, such as a field programmable gate array (FPGA). After the configuration mode, the IC operates in user mode, including the programmable logic circuit block 100. In the user mode, programmable logic circuit 120 in programmable logic circuit block 100 may perform one or more combinatorial logic functions to generate one or more output signals at its six outputs L1, L2, L3, L4, L5, and L6. The output signals generated at the L1 and L2 outputs of programmable logic circuit 120 are provided to inputs of NAND gate circuits 121-122, respectively. NAND gate circuits 121-122 generate output signals OUT1 and OUT2 in response to the output signals at the L1-L2 outputs, respectively, during user mode when the FRZ signal is in a logic low state.

The output signals generated at the L3, L4, L5, and L6 outputs of the programmable logic circuit 120 are provided to first data inputs of multiplexer circuits 141-144, respectively. Multiplexer circuits 141-144 may be programmed by select signals S1, S2, S3, and S4 to provide the values of the signals at the L3, L4, L5, and L6 outputs of programmable logic circuit 120 to output signals OUT3, OUT4, OUT5, and OUT6, respectively, during user mode when the FRZ signal is de-asserted to a logic low state. The freeze logic circuitry including AND gate circuits 101-106 and NOR gate circuits 111-116 do not provide additional delays in the paths of the output signals of programmable logic circuit 120 at outputs L1-L6 during user mode.

Two clear signals CLR0 and CLR1 generated by other circuits in the IC (or by externals sources) are provided to data inputs of the multiplexer circuit 145. Clear signals CLR0 and CLR1 may, for example, be user-controllable signals that can be varied during user mode of the IC. The clear signals CLR0 and CLR1 may be provided through the AND gate circuits 101-106 of the freeze logic circuitry, without adding any additional delay on the path of the freeze signal FRZ or on the paths of the output signals of programmable logic circuit 120. While having only one user-controllable clear signal CLR0 or CLR1 is sufficient for the operation of the circuit, having two user-controllable clear signals CLR0 and CLR1 in block 100 provides additional flexibility, without adding a significant amount of additional circuitry.

Multiplexer circuit 145 selects one of the two clear signals CLR0 and CLR1 based on the logic state of a fifth select signal S5 and provides the logic state of the selected clear signal CLR0 or CLR1 to a data input of flip-flop circuit 135 and to a first data input of multiplexer circuit 146. Multiplexer circuit 146 provides the logic state of either the output signal of multiplexer circuit 145 or the output signal of flip-flop circuit 135 to its output as signal SCLR based on the logic state of a sixth select signal S6. Signal SCLR is provided to a first input of each of the AND gate circuits 101-106 and to a first input of each of the OR gate circuits 117-118. The second inputs of the AND gate circuits 101-106 receive signals C1-C6, respectively, and the second inputs of the OR gate circuits 117-118 receive signals C7-C8, respectively.

Signal SCLR may function as a user-controllable freeze control signal in user mode of the IC. Either of the two clear signals CLR0 or CLR1 and any of the C1-C6 signals may be asserted to logic high states in user mode to reset corresponding ones of the output signals OUT1-OUT6 of block 100 to logic high states. If the SCLR signal is in a logic high state in response to the selected clear signal CLR0 or CLR1 being in a logic high state, and any of the C1-C6 signals are also in logic high states, then corresponding ones of the AND gate circuits 101-106 cause the corresponding ones of the NOR gate circuits 111-116 to drive their output signals to logic low states. In response to one or more of the output signals of NOR gate circuits 111-116 being in logic low states, the corresponding ones of the NAND gate circuits 121-122 and the multiplexer circuits 141-144 drive their respective output signals OUT1-OUT6 to logic high states. One or more of the C1-C6 signals may be in logic low states to prevent the freeze control signal SCLR from affecting the corresponding output signals OUT1-OUT6 of block 100.

The freeze control signal SCLR may also be used to affect the output signals OUT3, OUT4, OUT5, and OUT6 in user mode via OR gate circuits 117-118. For example, in response to signal C7 being in a logic high state, OR gate circuit 117 provides the logic state of the SCLR signal to inputs of AND gate circuits 107-108. In response to signal C8 being in a logic high state, OR gate circuit 118 provides the logic state of the SCLR signal to inputs of AND gate circuits 109-110. The second inputs of AND gate circuits 107-110 are coupled to the L3, L4, L5, and L6 outputs of programmable logic circuit 120, respectively. The outputs of the AND gate circuits 107, 108, 109, and 110 are coupled to data inputs of flip-flop circuits 131-134, respectively. The outputs of flip-flop circuits 131-134 are coupled to the second data inputs of multiplexer circuits 141-144, respectively. Multiplexer circuits 141-144 are programmable by select signals S1-S4 during user mode to provide the logic states of the output signals at the L3-L6 outputs or the output signals of the flip-flop circuits 131-134 to output signals OUT3-OUT6, respectively.

Figure 2:
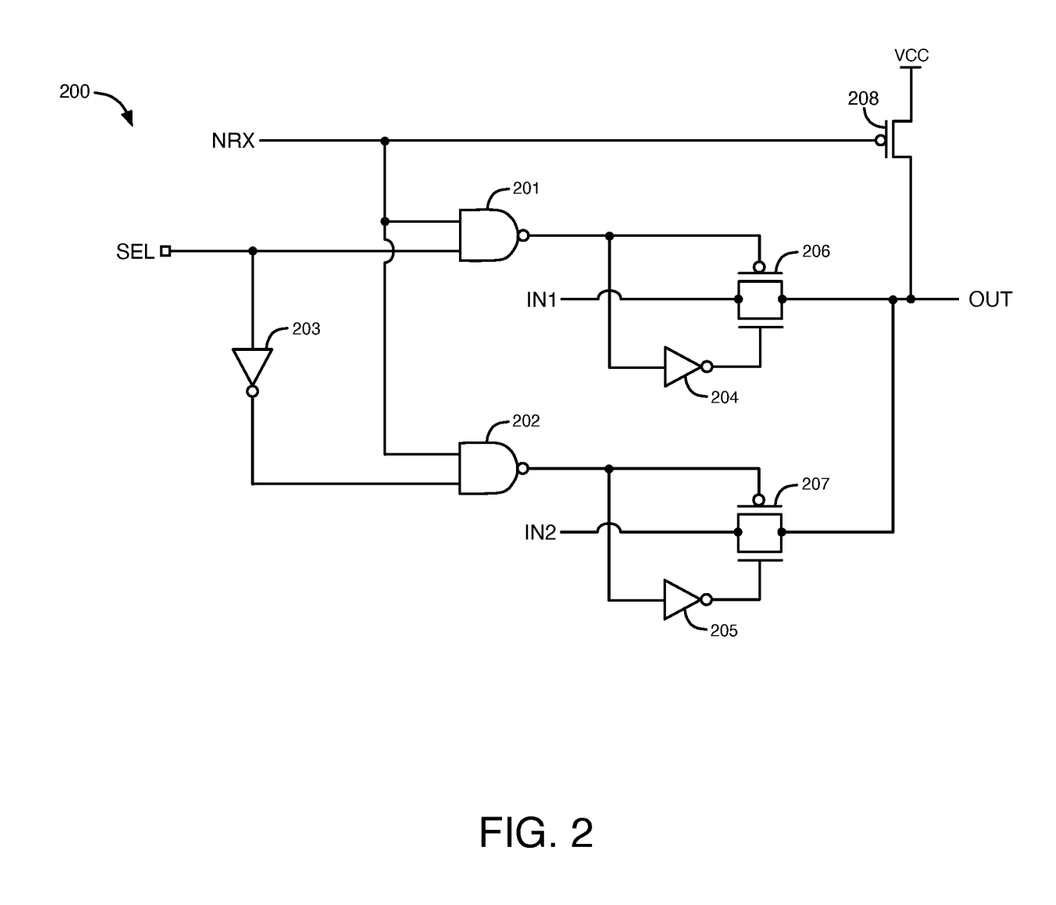
FIG. 2 illustrates an example of a multiplexer circuit that may be used to implement each of the multiplexer circuits in the programmable logic circuit block of FIG. 1.

FIG. 2 is a diagram that illustrates an example of a multiplexer circuit 200 that may be used to implement each of the multiplexer circuits 141-144 in the programmable logic circuit block 100 of FIG. 1. In an embodiment, each of the multiplexer circuits 141-144 shown in FIG. 1 includes an instance of the multiplexer circuit 200. Multiplexer circuit 200 includes NAND logic gate circuits 201-202, inverter circuits 203-205, pass gate circuits 206-207, and p-channel field-effect transistor 208. In multiplexer circuits 141-144, the output signal of the respective one of the NOR logic gate circuits 113-116 is provided to the gate of p-channel transistor 208 and to the first inputs of NAND logic gate circuits 201-202 as signal NRX. A select signal SEL is provided to a second input of NAND gate circuit 201. Inverter circuit 203 provides an inverted version of signal SEL to a second input of NAND gate circuit 202. The SEL signal corresponds to signals S1-S4 in multiplexer circuits 141-144, respectively. The output signal of NAND gate circuit 201 is provided to a first control input of pass gate circuit 206, and an inverted version of the output signal of NAND gate circuit 201 is provided to a second control input of pass gate circuit 206 through inverter circuit 204. The output signal of NAND gate circuit 202 is provided to a first control input of pass gate circuit 207, and an inverted version of the output signal of NAND gate circuit 202 is provided to a second control input of pass gate circuit 207 through inverter circuit 205.

The data inputs of pass gate circuits 206-207 are coupled to the 2 data inputs IN1 and IN2 of multiplexer circuit 200. The data inputs IN1 and IN2 of multiplexer circuit 200 correspond to the data inputs of multiplexer circuits 141-144 that are coupled to the L3-L6 outputs and flip-flop circuits 131-134, respectively. The outputs of the pass gate circuits 206-207 and transistor 208 are coupled to the output OUT of the multiplexer circuit 200. The output OUT of multiplexer circuit 200 generates the output signals OUT3-OUT6 of multiplexer circuits 141-144, respectively. In response to signal NRX being in a logic low state, p-channel transistor 208 is on, and p-channel transistor 208 pulls the voltage at output OUT to the supply voltage VCC, which corresponds to a logic high state. Thus, in response to the output signal of one of the NOR logic gate circuits 113-116 being in a logic low state in response to the FRZ signal or the SCLR signal being asserted, the transistor 208 in the respective multiplexer circuit 141-144 pulls the output signal at OUT to a logic high state, as described above.

Figure 3:
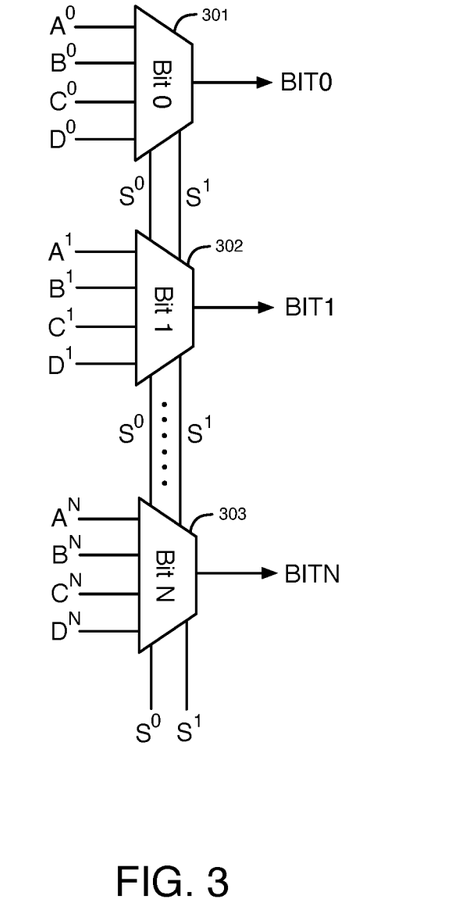
FIG. 3 is a diagram that illustrates an example of a bus of multiplexer circuits.

According to an example of an application of the circuitry of FIG. 1, one or more programmable logic circuit blocks 100 can be used as a more efficient implementation of buses of multiplexers. FIG. 3 is a diagram that illustrates an example of a bus of multiplexer circuits that can be mapped to the circuitry of FIG. 1. The bus of multiplexer circuits of FIG. 3 may include any number N of multiplexer circuits. Three multiplexer circuits 301, 302, and 303 are shown in FIG. 3 as an example. Each of the multiplexer circuits of FIG. 3 receives 4 input signals at 4 data inputs. Multiplexer circuit 301 receives input signals $A^0$, $B^0$, $C^0$, and $D^0$ at its data inputs. Multiplexer circuit 301 generates output signal BIT0 at its output. Multiplexer circuit 302 receives input signals $A^1$, $B^1$, $C^1$, and $D^1$ at its data inputs. Multiplexer circuit 302 generates output signal BIT1 at its output. Multiplexer circuit 303 receives input signals $A^N$, $B^N$, $C^N$, and $D^N$ at its data inputs. Multiplexer circuit 303 generates output signal BITN at its output. Two input select signals $S^0$ and $S^1$ are provided to 2 select inputs of each of the multiplexer circuits in the bus of multiplexer circuits of FIG. 3, including to the select inputs of each of multiplexer circuits 301-303. Each of the multiplexer circuits in the bus of multiplexers circuits of FIG. 3, including each of multiplexer circuits 301-303, provides the value of a selected one of the input signals at its data inputs to its output based on the values of the select signals $S^0$ and $S^1$.

Figure 4:
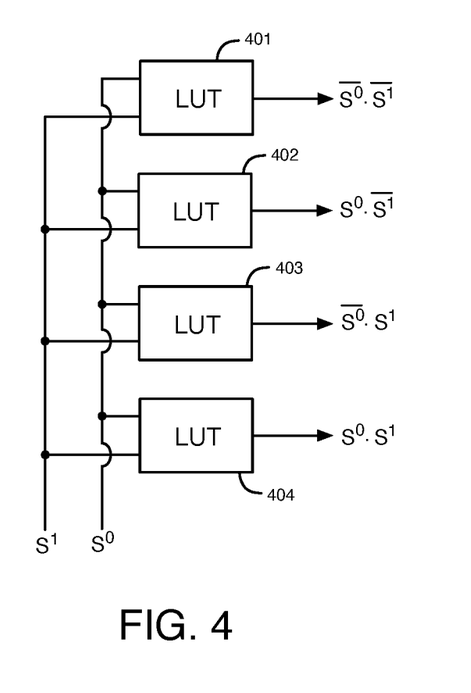
FIG. 4 is a diagram that illustrates how select signals of a multiplexer circuit can be decoded into four decoded signals for an alternative implementation of the multiplexer circuits shown in FIG. 3.

FIG. 4 is a diagram that illustrates how select signals of a multiplexer circuit can be decoded into four decoded signals in an alternative implementation of the multiplexer circuits shown in FIG. 3. In the example of FIG. 4, 4 lookup-table (LUT) circuits 401-404 decode the two input select signals $S^0$ and $S^1$ to generate 4 decoded output signals. The input select signals $S^0$ and $S^1$ are provided to the inputs of each of the LUT circuits 401-404. LUT circuit 401 generates a decoded output signal that equals $\overline{S^0} \cdot \overline{S^1}$ based on signals $S^0$ and $S^1$, where $\overline{S^0} \cdot \overline{S^1}$ equals the inverse of $S^0$ multiplied by (i.e., ANDed with) the inverse of $S^1$. LUT circuit 402 generates a decoded output signal $S^0 \cdot \overline{S^1}$ based on signals $S^0$ and $S^1$, where $S^0 \cdot \overline{S^1}$ equals $S^0$ multiplied by (i.e., ANDed with) the inverse of $S^1$. LUT circuit 403 generates a decoded output signal $\overline{S^0} \cdot S^1$ based on signals $S^0$ and $S^1$, where $\overline{S^0} \cdot S^1$ equals the inverse of $S^0$ multiplied by (i.e., ANDed with) $S^1$. LUT circuit 404 generates a decoded output signal $S^0 \cdot S^1$ based on signals $S^0$ and $S^1$, where $S^0 \cdot S^1$ equals $S^0$ multiplied by (i.e., ANDed with) $S^1$. Thus, the LUT circuits 401-404 generate 4 decoded signals having values equal to $\overline{S^0} \cdot \overline{S^1}$, $S^0 \cdot \overline{S^1}$, $\overline{S^0} \cdot S^1$, and $S^0 \cdot S^1$, respectively.

Figure 5:
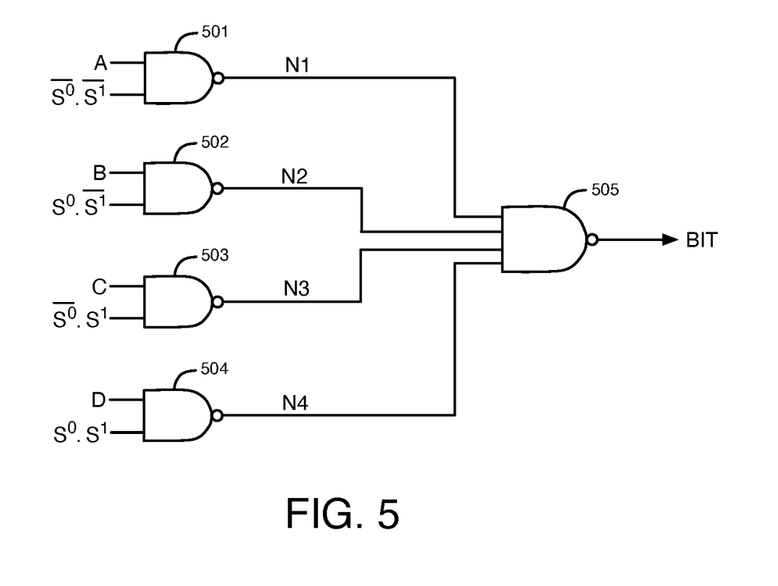
FIG. 5 is a diagram that illustrates an alternative implementation of a multiplexer circuit using the decoded signals generated by the circuitry of FIG. 4.

FIG. 5 is a diagram that illustrates an example of an alternative implementation of a multiplexer circuit using the 4 decoded signals generated by the circuitry of FIG. 4. The multiplexer circuit of FIG. 5 includes 5 NAND logic gate circuits 501-505. Input signals A, B, C, and D are provided to inputs of NAND gate circuits 501, 502, 503, and 504, respectively. The 4 decoded output signals of the LUT circuits 401-404 of FIG. 4 that have values equal to $\overline{S^0} \cdot \overline{S^1}$, $S^0 \cdot \overline{S^1}$, $\overline{S^0} \cdot S^1$, and $S^0 \cdot S^1$ are provided as input signals to the NAND gate circuits 501, 502, 503, and 504, respectively, of FIG. 5.

NAND gate circuit 501 performs a NAND Boolean logic function on the values of A and $\overline{S^0} \cdot \overline{S^1}$ to generate the value of its output signal N1. NAND gate circuit 502 performs a NAND Boolean logic function on the values of B and $S^0 \cdot \overline{S^1}$ to generate the value of its output signal N2. NAND gate circuit 503 performs a NAND Boolean logic function on the values of C and $\overline{S^0} \cdot S^1$ to generate the value of its output signal N3. NAND gate circuit 504 performs a NAND Boolean logic function on the values of D and $S^0 \cdot S^1$ to generate the value of its output signal N4. NAND gate circuit 505 performs a NAND Boolean logic function on the values of signals N1, N2, N3, and N4 to generate the value of its output signal BIT. The LUT circuits 401-404 of FIG. 4 and the NAND gate circuits 501-505 of FIG. 5 together are an alternative implementation of each of the multiplexer circuits of FIG. 3.

In an embodiment, the NAND logic gate circuits 501-504 may be implemented by the multiplexer circuits 141-144 in block 100 of FIG. 1. In this embodiment, the 4 signals having values equal to $\overline{S^0} \cdot \overline{S^1}$, $S^0 \cdot \overline{S^1}$, $\overline{S^0} \cdot S^1$, and $S^0 \cdot S^1$ may be provided to inputs of multiplexer circuits 141-144 via multiplexer circuits 145-146, OR gate circuits 117-118 and the AND gate circuits 107-110 or from the L3-L6 outputs of programmable logic circuit 120. In this embodiment, a bus of 6-input LUTs (i.e., 4:1 multiplexers) are converted into a bus of 4-input LUTs and 4 2-input LUTs 401-404. This embodiment can provide, for example, a 2.4% reduction in the number of programmable logic circuit blocks used to implement a bus of multiplexer circuits.

Figure 6:
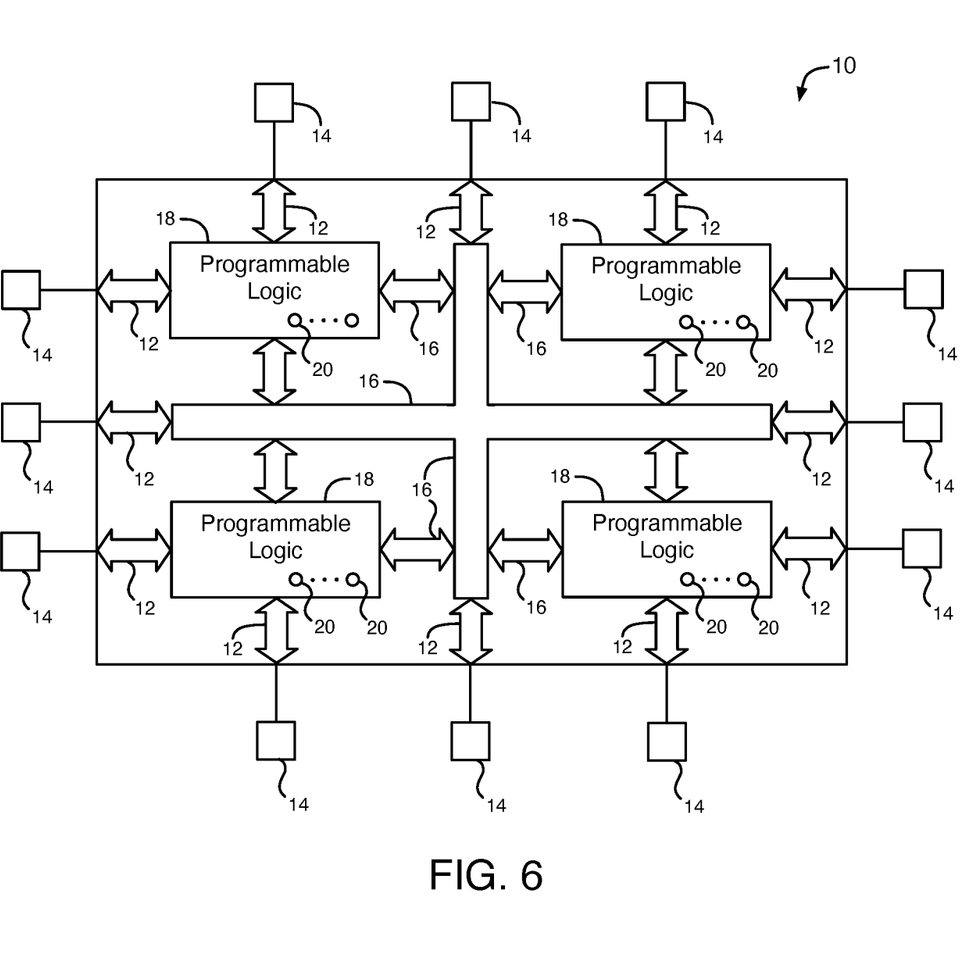
FIG. 6 is a diagram of an illustrative programmable (i.e., configurable) logic integrated circuit (IC) that may include any of the circuitry shown in FIGS. 1-5.

FIG. 6 is a diagram of an illustrative programmable (i.e., configurable) logic integrated circuit (IC) 10 that may include any of the circuitry shown in FIGS. 1-5 herein. As shown in FIG. 6, programmable logic integrated circuit 10 may have input-output circuitry 12 for driving signals off of IC 10 and for receiving signals from other devices via input-output pads 14. Interconnection resources 16 such as global, regional, and local vertical and horizontal conductive lines and buses may be used to route signals on IC 10. Interconnection resources 16 include fixed interconnects (conductive lines) and programmable interconnects (i.e., programmable connections between respective fixed interconnects). Programmable logic circuitry 18 may include combinational and sequential logic circuitry. Programmable logic circuitry 18 may be configured to perform custom logic functions. Programmable logic circuitry 18 may include one or more programmable logic circuit blocks 100, as disclosed herein with respect to FIG. 1.

Programmable logic IC 10 contains memory elements 20 that can be loaded with configuration data using pads 14 and input-output circuitry 12. Once loaded, the memory elements 20 may each provide a corresponding static control output signal that controls the state of an associated logic component in programmable logic circuitry 18. Typically, the memory element output signals are used to control the gates of field-effect transistors. In the context of programmable integrated circuits, the memory elements 20 store configuration data and are sometimes referred to as configuration random-access memory (CRAM) cells.

In general, software and data for performing any of the functions disclosed herein may be stored in non-transitory computer readable storage media. Non-transitory computer readable storage media is tangible computer readable storage media that stores data for a significant period of time, as opposed to media that only transmits propagating electrical signals (e.g., wires). The software code may sometimes be referred to as software, data, program instructions, instructions, or code. The non-transitory computer readable storage media may, for example, include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s).

Further examples are now disclosed. Example 1 is an integrated circuit comprising: a programmable logic circuit; freeze logic circuitry comprising a first input coupled to receive a freeze signal and a second input coupled to receive a control signal;

second logic circuitry comprising a first input coupled to a first output of the programmable logic circuit and a second input coupled to an output of the freeze logic circuitry, wherein the freeze logic circuitry drives an output signal of the second logic circuitry to a predefined logic state in response to the freeze signal being asserted during power-up of the integrated circuit; and clear logic circuitry that generates the control signal in response to a clear signal, wherein the freeze logic circuitry drives the output signal of the second logic circuitry to the predefined logic state in response to the control signal being asserted after the power-up of the integrated circuit.

In Example 2, the integrated circuit of Example 1 may optionally include, wherein the freeze logic circuitry comprises a first logic gate circuit comprising an input coupled to receive the control signal, and wherein the freeze logic circuitry further comprises a second logic gate circuit that comprises a first input coupled to an output of the first logic gate circuit and a second input coupled to receive the freeze signal.

In Example 3, the integrated circuit of Example 2 may optionally include, wherein the freeze logic circuitry further comprises a third logic gate circuit comprising an input coupled to receive the control signal, and wherein the freeze logic circuitry further comprises a fourth logic gate circuit that comprises a first input coupled to an output of the third logic gate circuit and a second input coupled to receive the freeze signal.

In Example 4, the integrated circuit of Example 3 may further comprise: fourth logic circuitry comprising a first input coupled to a second output of the programmable logic circuit and a second input coupled to an output of the fourth logic gate circuit, wherein the freeze logic circuitry drives an output signal of the fourth logic circuitry to the predefined logic state in response to the freeze signal being asserted during the power-up of the integrated circuit, and wherein the freeze logic circuitry drives the output signal of the fourth logic circuitry to the predefined logic state in response to the control signal being asserted after the power-up of the integrated circuit.

In Example 5, the integrated circuit of Example 4 may optionally include, wherein the second logic circuitry comprises a NAND gate circuit, and wherein the fourth logic circuitry comprises a multiplexer circuit.

In Example 6, the integrated circuit of any one of Examples 1-5 may optionally include, wherein the second logic circuitry is configurable to implement at least a portion of a bus of multiplexer circuits.

In Example 7, the integrated circuit of any one of Examples 1-4 may optionally include, wherein the second logic circuitry comprises a NAND gate circuit.

In Example 8, the integrated circuit of any one of Examples 1-4 may optionally include, wherein the second logic circuitry comprises a multiplexer circuit, and wherein the freeze logic circuitry controls an input of the multiplexer circuit.

In Example 9, the integrated circuit of any one of Examples 1-8 may optionally include, wherein the clear logic circuitry comprises a multiplexer circuit configurable to select a value of the clear signal or a value of an additional clear signal to be provided in the control signal.

Example 10 is a method for controlling an output signal of a first logic circuit in an integrated circuit, the method comprising: driving the output signal of the first logic circuit to a predefined logic state with freeze circuitry in response to a freeze signal being asserted during power-up of the integrated circuit; controlling the output signal of the first logic circuit based on a first output signal of a programmable logic circuit after the power-up of the integrated circuit in response to the freeze signal being de-asserted; asserting a control signal with clear logic circuitry in response to a clear signal after the power-up of the integrated circuit; and driving the output signal of the first logic circuit to the predefined logic state with the freeze circuitry in response to the control signal being asserted.

In Example 11, the method of Example 10 may further comprise: driving an output signal of a second logic circuit to the predefined logic state with the freeze circuitry in response to the freeze signal being asserted during the power-up of the integrated circuit.

In Example 12, the method of Example 11 may further comprise: controlling the output signal of the second logic circuit based on a second output signal of the programmable logic circuit after the power-up of the integrated circuit in response to the freeze signal being de-asserted.

In Example 13, the method of Example 12 may further comprise: driving the output signal of the second logic circuit to the predefined logic state with the freeze circuitry in response to the control signal being asserted.

In Example 14, the method of any one of Examples 10-13 may optionally include, wherein the freeze circuitry comprises a first logic gate circuit comprising an input coupled to receive the control signal, and wherein the freeze circuitry further comprises a second logic gate circuit that comprises a first input coupled to an output of the first logic gate circuit and a second input coupled to receive the freeze signal.

In Example 15, the method of any one of Examples 10-14 may optionally include, wherein asserting the control signal with the clear logic circuitry further comprises selecting a value of the clear signal or a value of an additional clear signal with a multiplexer circuit in the clear logic circuitry to generate a value of the control signal.

Example 16 is an integrated circuit comprising: a programmable logic circuit; freeze circuitry coupled to receive a freeze signal and a control signal; a first logic circuit coupled to receive a first output signal of the programmable logic circuit, wherein the first logic circuit is coupled to receive an output signal of the freeze circuitry, and wherein the freeze circuitry causes an output signal of the first logic circuit to be in a predefined logic state in response to the freeze signal being asserted during power-up of the integrated circuit; and clear circuitry that asserts the control signal in response to a clear signal being asserted after the power-up of the integrated circuit, wherein the freeze circuitry causes the output signal of the first logic circuit to be in the predefined logic state in response to the control signal being asserted.

In Example 17, the integrated circuit of Example 16 may further comprise: a second logic circuit coupled to receive a second output signal of the programmable logic circuit, wherein the second logic circuit is coupled to receive the output signal of the freeze circuitry, and wherein the freeze circuitry causes an output signal of the second logic circuit to be in the predefined logic state in response to the freeze signal being asserted during the power-up of the integrated circuit.

In Example 18, the integrated circuit of Example 17 may optionally include, wherein the freeze circuitry causes the output signal of the second logic circuit to be in the predefined logic state in response to the control signal being asserted.

In Example 19, the integrated circuit of any one of Examples 16-18 may optionally include, wherein the clear circuitry comprises a multiplexer circuit configurable to select a value of the clear signal or a value of an additional clear signal to be provided as a value of the control signal.

In Example 20, the integrated circuit of any one of Examples 16-19 may optionally include, wherein the freeze circuitry comprises a first logic gate circuit coupled to receive the control signal, and wherein the freeze circuitry further comprises a second logic gate circuit coupled to receive an output signal of the first logic gate circuit and the freeze signal.

It will be recognized by one skilled in the art, that the examples disclosed herein may be practiced without some or all of these specific details. In other instances, well-known operations have not been described in detail in order not to obscure the present examples. It should be appreciated that the examples disclosed herein can be implemented in numerous ways, such as a process, an apparatus, a system, a device, or a method on a computer readable medium.

The foregoing description of the examples has been presented for the purpose of illustration. The foregoing description is not intended to be exhaustive or to be limiting to the examples disclosed herein. In some instances, features of the examples can be employed without a corresponding use of other features as set forth. Many modifications, substitutions, and variations are possible in light of the above teachings.

What is claimed is:

1. An integrated circuit comprising:
a programmable logic circuit;
freeze logic circuitry comprising a first input coupled to receive a freeze signal and a second input coupled to receive a control signal;
second logic circuitry comprising a first input coupled to a first output of the programmable logic circuit and a second input coupled to an output of the freeze logic circuitry, wherein the freeze logic circuitry drives an output signal of the second logic circuitry to a predefined logic state in response to the freeze signal being asserted during power-up of the integrated circuit; and
clear logic circuitry that generates the control signal in response to a clear signal, wherein the freeze logic circuitry drives the output signal of the second logic circuitry to the predefined logic state in response to the control signal being asserted after the power-up of the integrated circuit.

2. The integrated circuit of claim 1, wherein the freeze logic circuitry comprises a first logic gate circuit comprising an input coupled to receive the control signal, and wherein the freeze logic circuitry further comprises a second logic gate circuit that comprises a first input coupled to an output of the first logic gate circuit and a second input coupled to receive the freeze signal.

3. The integrated circuit of claim 2, wherein the freeze logic circuitry further comprises a third logic gate circuit comprising an input coupled to receive the control signal, and wherein the freeze logic circuitry further comprises a fourth logic gate circuit that comprises a first input coupled to an output of the third logic gate circuit and a second input coupled to receive the freeze signal.

4. The integrated circuit of claim 3 further comprising:
fourth logic circuitry comprising a first input coupled to a second output of the programmable logic circuit and a second input coupled to an output of the fourth logic gate circuit, wherein the freeze logic circuitry drives an output signal of the fourth logic circuitry to the predefined logic state in response to the freeze signal being asserted during the power-up of the integrated circuit, and wherein the freeze logic circuitry drives the output signal of the fourth logic circuitry to the predefined logic state in response to the control signal being asserted after the power-up of the integrated circuit.

5. The integrated circuit of claim 4, wherein the second logic circuitry comprises a NAND gate circuit, and wherein the fourth logic circuitry comprises a multiplexer circuit.

6. The integrated circuit of claim 1, wherein the second logic circuitry is configurable to implement at least a portion of a bus of multiplexer circuits.

7. The integrated circuit of claim 1, wherein the second logic circuitry comprises a NAND gate circuit.

8. The integrated circuit of claim 1, wherein the second logic circuitry comprises a multiplexer circuit, and wherein the freeze logic circuitry controls an input of the multiplexer circuit.

9. The integrated circuit of claim 1, wherein the clear logic circuitry comprises a multiplexer circuit configurable to select a value of the clear signal or a value of an additional clear signal to be provided in the control signal.

10. A method for controlling an output signal of a first logic circuit in an integrated circuit, the method comprising:
driving the output signal of the first logic circuit to a predefined logic state with freeze circuitry in response to a freeze signal being asserted during power-up of the integrated circuit;
controlling the output signal of the first logic circuit based on a first output signal of a programmable logic circuit after the power-up of the integrated circuit in response to the freeze signal being de-asserted;
asserting a control signal with clear logic circuitry in response to a clear signal after the power-up of the integrated circuit; and driving the output signal of the first logic circuit to the predefined logic state with the freeze circuitry in response to the control signal being asserted.

11. The method of claim 10 further comprising:
driving an output signal of a second logic circuit to the predefined logic state with the freeze circuitry in response to the freeze signal being asserted during the power-up of the integrated circuit.

12. The method of claim 11 further comprising:
controlling the output signal of the second logic circuit based on a second output signal of the programmable logic circuit after the power-up of the integrated circuit in response to the freeze signal being de-asserted.

13. The method of claim 12 further comprising:
driving the output signal of the second logic circuit to the predefined logic state with the freeze circuitry in response to the control signal being asserted.

14. The method of claim 10, wherein the freeze circuitry comprises a first logic gate circuit comprising an input coupled to receive the control signal, and wherein the freeze circuitry further comprises a second logic gate circuit that comprises a first input coupled to an output of the first logic gate circuit and a second input coupled to receive the freeze signal.

15. The method of claim 10, wherein asserting the control signal with the clear logic circuitry further comprises selecting a value of the clear signal or a value of an additional clear signal with a multiplexer circuit in the clear logic circuitry to generate a value of the control signal.

16. An integrated circuit comprising:
a programmable logic circuit;
freeze circuitry coupled to receive a freeze signal and a control signal;
a first logic circuit coupled to receive a first output signal of the programmable logic circuit, wherein the first logic circuit is coupled to receive an output signal of the freeze circuitry, and wherein the freeze circuitry causes an output signal of the first logic circuit to be in a predefined logic state in response to the freeze signal being asserted during power-up of the integrated circuit; and
clear circuitry that asserts the control signal in response to a clear signal being asserted after the power-up of the integrated circuit, wherein the freeze circuitry causes the output signal of the first logic circuit to be in the predefined logic state in response to the control signal being asserted.

17. The integrated circuit of claim 16 further comprising:
a second logic circuit coupled to receive a second output signal of the programmable logic circuit, wherein the second logic circuit is coupled to receive the output signal of the freeze circuitry, and wherein the freeze circuitry causes an output signal of the second logic circuit to be in the predefined logic state in response to the freeze signal being asserted during the power-up of the integrated circuit.

18. The integrated circuit of claim 17, wherein the freeze circuitry causes the output signal of the second logic circuit to be in the predefined logic state in response to the control signal being asserted.

19. The integrated circuit of claim 16, wherein the clear circuitry comprises a multiplexer circuit configurable to select a value of the clear signal or a value of an additional clear signal to be provided as a value of the control signal.

20. The integrated circuit of claim 16, wherein the freeze circuitry comprises a first logic gate circuit coupled to receive the control signal, and wherein the freeze circuitry further comprises a second logic gate circuit coupled to receive an output signal of the first logic gate circuit and the freeze signal.

* * * * *